United States Patent
Lin et al.

(10) Patent No.: US 9,515,258 B2
(45) Date of Patent: Dec. 6, 2016

(54) MEMORY STRUCTURE AND MANUFACTURING METHOD OF THE SAME

(71) Applicant: MACRONIX INTERNATIONAL CO., LTD., Hsinchu (TW)

(72) Inventors: Yu-Yu Lin, New Taipei (TW); Feng-Min Lee, Hsinchu (TW); Chien-Hung Lu, Hsinchu (TW); Chin-Yi Tseng, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/729,181

(22) Filed: Jun. 3, 2015

(65) Prior Publication Data

US 2016/0218284 A1    Jul. 28, 2016

Related U.S. Application Data

(60) Provisional application No. 62/106,744, filed on Jan. 23, 2015.

(51) Int. Cl.
*H01L 45/00* (2006.01)

(52) U.S. Cl.
CPC ....... *H01L 45/1253* (2013.01); *H01L 45/1233* (2013.01); *H01L 45/1683* (2013.01)

(58) Field of Classification Search
CPC ............. H01L 45/1233; H01L 45/1253; H01L 45/1683; H01L 29/66181; H01L 29/945; H01L 21/76807

USPC .......... 257/211, 508, 296, 647; 438/98, 243, 438/386, 637, 629, 668

See application file for complete search history.

(56) References Cited

U.S. PATENT DOCUMENTS

| 8,134,139 | B2 * | 3/2012 | Lin | H01L 45/144 257/2 |
| 2012/0280199 | A1 * | 11/2012 | Takagi | H01L 27/101 257/3 |
| 2015/0228491 | A1 * | 8/2015 | Kang | H01L 21/28194 257/330 |

FOREIGN PATENT DOCUMENTS

TW    200832679 A    8/2008

OTHER PUBLICATIONS

TIPO Office Action dated May 25, 2016 in Taiwan application (No. 104117896).

* cited by examiner

*Primary Examiner* — Jarrett Stark
*Assistant Examiner* — Shahed Ahmed
(74) *Attorney, Agent, or Firm* — McClure, Qualey & Rodack, LLP

(57) ABSTRACT

A memory structure including an insulating layer, a first electrode layer and a first barrier is provided. The insulating layer has a recess. The first electrode layer is formed in the recess and has a first top surface. The first barrier is formed between the insulating layer and the first electrode layer, and has a second top surface lower than the first top surface. The first top surface and the second top surface are lower than an opening of the recess.

14 Claims, 4 Drawing Sheets

MEMORY STRUCTURE AND MANUFACTURING METHOD OF THE SAME

This application claims the benefit of U.S. provisional application Ser. No. 62/106,744, filed Jan. 23, 2015, the disclosure of which is incorporated by reference herein in its entirety.

TECHNICAL FIELD

The disclosure relates in general to a memory structure and a manufacturing method of the same, and more particularly to a resistive random-access memory (ReRAM) structure and a manufacturing method of the same.

BACKGROUND

With the development of semiconductor technology, various semiconductor elements are invented. For example, memories, transistors, and diodes are widely used in various types of electronic devices. In the development of memory technology, researchers have been trying to make a variety of types of developments and improvements, and random-access memory (ReRAM) is one of the types.

ReRAM that apply difference of resistance within the memory cells thereof for implementing the erase/program operation have advantages in terms of cell area, device density, power consumption, programming/erasing speed, three-dimensional integration, multi-value implementation, and the like over FLASH memory devices.

Generally, it is necessary to have a smaller contact size and flat contact surface for ReRAM to shrink the size of the memory. However, it would be difficult to achieve the goals mentioned above by the traditional etching process.

SUMMARY

The disclosure is directed to a resistive random-access memory structure and a manufacturing method of the same. The memory structure may have a flat contact surface for better uniformity and a smaller contact size by two-step (or multi-step) etching process.

According to one embodiment, a memory structure including an insulating layer, a first electrode layer and a first barrier is provided. The insulating layer has a recess. The first electrode layer is formed in the recess and has a first top surface. The first barrier is formed between the insulating layer and the first electrode layer, and has a second top surface lower than the first top surface. The first top surface and the second top surface are lower than an opening of the recess.

According to another embodiment, a memory structure including an insulating layer, a first electrode layer and a first barrier is provided. The insulating layer has a recess. The first electrode layer is formed in the recess and has a first top surface. The first barrier is formed between the insulating layer and the first electrode layer, and has a second top surface. The first top surface and the second top surface are lower than an opening of the recess, and an area of the first top surface is between 85 and 99% of an area of the opening.

According to an alternative embodiment, a manufacturing method of a memory structure is provided. The method includes the following steps. An insulating layer having a recess is formed. A first electrode layer and a first barrier layer are formed in the recess, and the first barrier layer is disposed between the insulating layer and the first electrode layer. The first electrode layer is etched to reach a first pre-determined height. The first barrier layer is etched to reach a second pre-determined height. The second pre-determined height is lower than the first pre-determined height.

Figure 1:
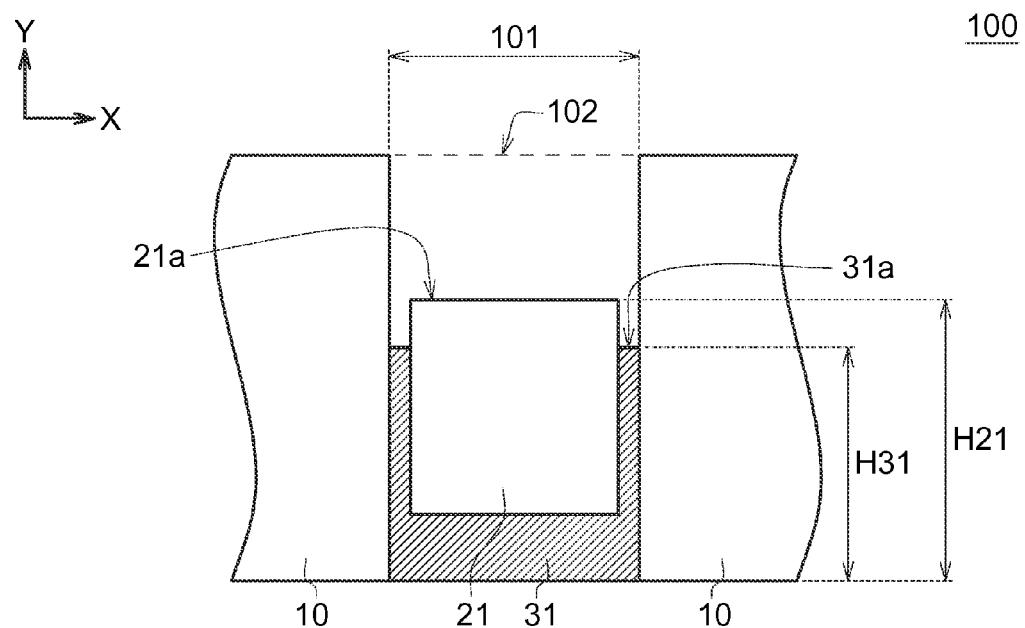
FIG. 1 illustrates a partial cross-section view of the memory structure according to the embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and there may be other embodiments of the present disclosure which are not specifically illustrated. Thus, the specification and the drawings are regarded as an illustrative sense rather than a restrictive sense.

FIG. 1 illustrates a partial cross-section view of the memory structure 100 according to the embodiment of the disclosure. As shown in FIG.1, the memory structure 100 includes an insulating layer 10, a first electrode layer 21, and a first barrier layer 31. The insulating layer 10 has a recess 101. The first electrode layer 21 is formed in the recess 101, and has a first top surface 21a. The first barrier layer 31 is formed between the insulating layer 10 and the first electrode layer 21, and has a second top surface 31a.

In the embodiment of the disclosure, the second top surface 31a is lower than the first top surface 21a. That is, the height H21 of the first top surface 21a of the first electrode layer 21 is higher than the height H23 of the second top surface 31a of the first barrier layer 31 along Y-direction. As shown in FIG. 1, the first top surface 21a and the second top surface 31a are both lower than the opening 102 of the recess 101. Further, the area of the first top surface 21a may be between 85 and 99% of the area of the opening 102.

It should be noted that since the first top surface 21a of the first electrode layer 21 is not completely flat, here, the height H21 is defined as the average height of each of the points on the first top surface 21a. Similarly, the height H31 is defined as the average height of each of the points on the second top surface 31a.

Figure 2A:
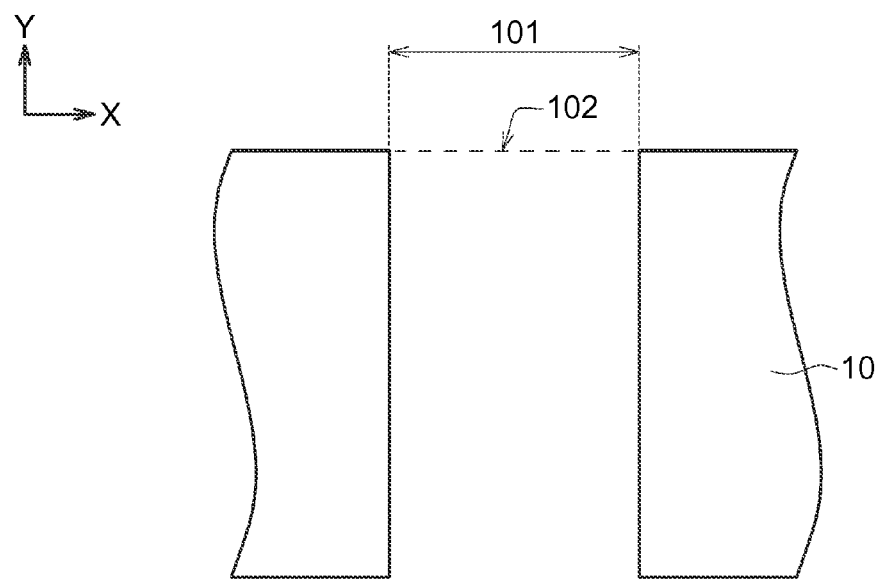
FIGS. 2A-2G show a process for manufacture the memory structure according to the embodiment of the disclosure.
Figure 2B:
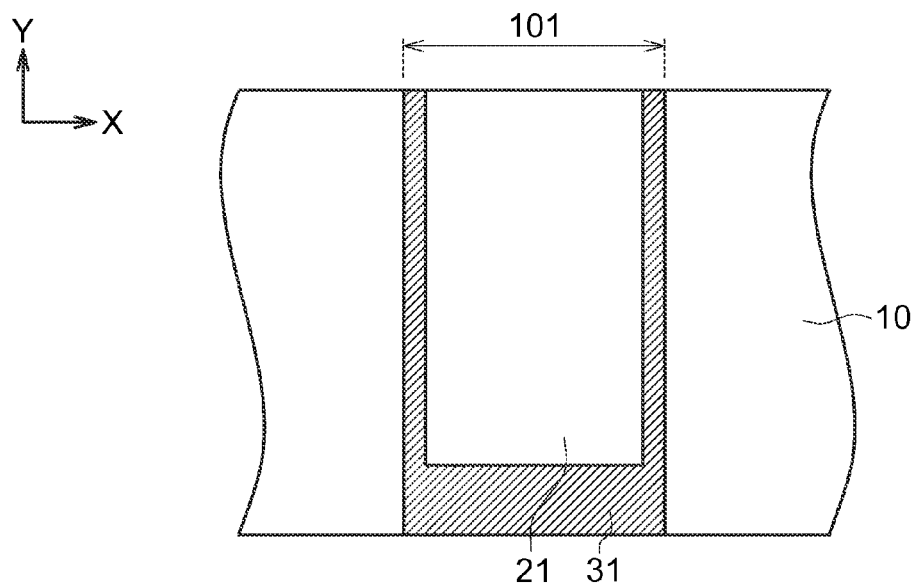

FIGS. 2A-2G show a process for manufacture the memory structure 100 according to the embodiment of the disclosure. As shown in FIG. 2A, an insulating layer 10 having a recess 101 is formed, and the recess 101 has an opening 102. As shown in FIG. 2B, a first electrode layer 21 and a first barrier layer 31 are formed in the recess 101. The first barrier layer 31 is disposed between the insulating layer 10 and the first electrode layer 21.

In one embodiments of the disclosure, the first electrode layer 21 may be formed by a low pressure chemical vapor deposition (LPCVD) or other suitable processes, and the first electrode layer 21 may be a conductive layer including metal material, such as copper (Cu), aluminum (Al), tungsten (W), titanium (Ti) or the arbitrary combinations thereof, non-metallic material or the combination thereof. In this embodiment, the first electrode layer 21 may be made of tungsten.

Further, the first barrier layer 31 may also be formed by a low pressure chemical vapor deposition process, and the first barrier layer 31 may be made of conductive material, for example, titanium nitride (TiN) or tantalum nitride (TaN). The etching rate of the conductive material used in the first barrier layer 31 is different from the etching rate of the conductive material used in the first electrode layer 21 and the etching rate of silicon dioxide ($SiO_2$).

Figure 2C:
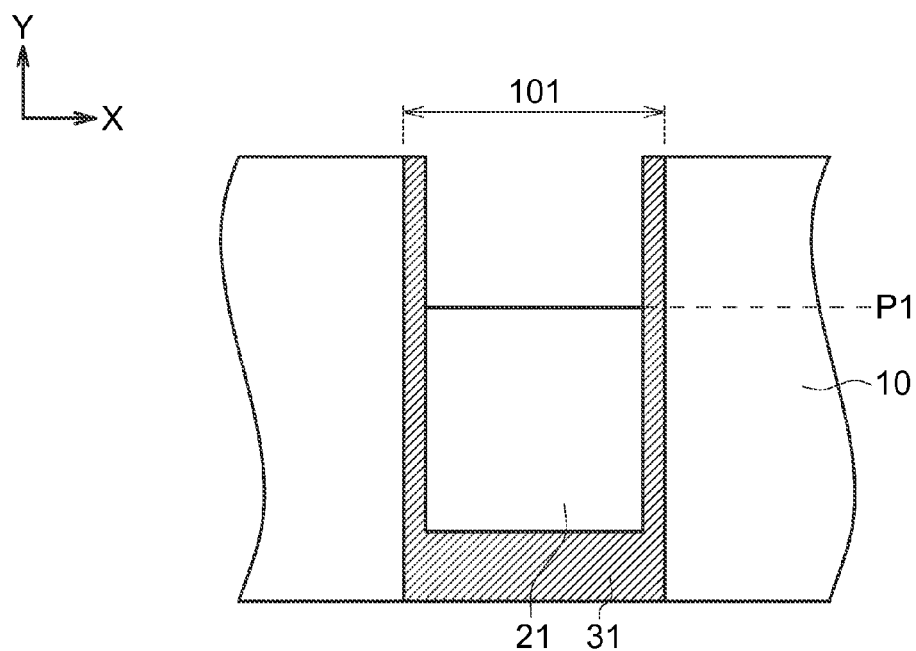

Then, the first electrode layer 21 and the first barrier layer 31 are etched. In the embodiment of the disclosure, the two-step (or multi-step) etching process is implemented. As shown in FIG. 2C, the first electrode layer 21 is etched to reach a first pre-determined height P1. Here, the etching gases used for etching the first electrode layer 21 may include sulfur hexafluoride ($SF_6$) and nitrogen ($N_2$). For example, 65 sccm (standard cubic centimeter per minute) sulfur hexafluoride and 20 sccm nitrogen are passed under 20 mtorr pressure, 200 W power for 30-60 seconds during the etching process. Since the etching gases have high selectivity between the first electrode layer 21 and the first barrier layer 31, the first barrier layer 31 may be maintained to be used as a protection layer of the insulating layer 10 during the step of etching the first electrode 21.

Figure 2D:
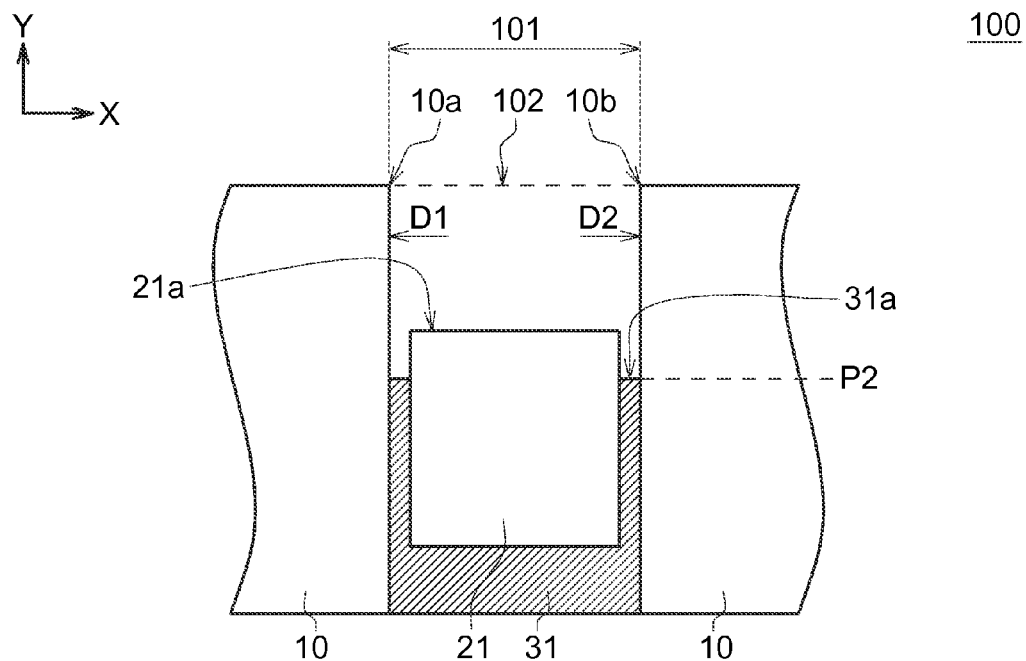

Then, the first barrier layer 31 is etched to reach a second pre-determined height P2 to form the memory structure 100 as shown in FIG. 2D. In this embodiment, the second pre-determined height P2 is lower than the first pre-determined height P1, such that the height H21 of the first top surface 21a of the first electrode layer 21 is higher than the height H31 of the second top surface 31a of the first barrier layer 31 (as shown in FIG. 1).

Here, the etching gases used for etching the first barrier layer 31 may include chlorine and argon. For example, 30 sccm of chlorine and 85 sccm of argon are passed under 5 mt pressure, 300 W power for 60 seconds during the etching process. That is, the pressure during the step of etching the first barrier layer 31 is larger than the pressure during the step of etching the first electrode layer 21, and the etching gases used for etching the first barrier layer 31 are different from and the etching gases used for etching the first electrode layer 21. Since the etching gases used in this stage have high selectivity between the first barrier layer 31 and the first electrode layer 21 and between the first barrier layer 31 and the insulating layer 10, the insulating layer 10 may be maintained during the step of etching the first barrier layer 31. Hence, the corners 10a and 10b of the insulating layer 10 near the opening 102 may be maintained sharp.

Therefore, the size of the opening 102 may be maintained by the two-step (or multi-step) etching process, and the opening 102 would not become larger during the etching process, such that the area of the first top surface 21a of the first electrode layer 21 may be between 85 and 99% of the area of the opening 102. That is, it is easier to achieve a smaller contact size in the memory structure 100 according to the embodiment of the disclosure.

Further, the etching rate of the first electrode layer 21 and the etching rate of the first barrier layer 31 may be slowed down during the two-step (or multi-step) etching process, such that the controllability may be enhanced and the flatter contact surface may be formed.

In the traditional etching process, single step may be implemented. That is, the first electrode layer 21 and the first barrier layer 31 are etched at the same time. The etching gases and the pressure in the traditional etching steps are different from etching gases and the pressure in the embodiment of the disclosure. The insulating layer 10 could not be the protection layer of the first barrier layer 31 by the traditional etching process, so that the insulating layer 10 would also be etched at the same time, and the corners 10a and 10b near the opening 102 may be rounding. That is, the opening 102 would become larger during the traditional etching process, such that the area of the first top surface 21a of the first electrode layer 21 may be smaller than 85% of the area of the opening 102, which is unfavorable for forming the small contact size in the memory structure.

Further, the etching gases used in the step of etching the first barrier layer 31 shown in FIG. 2D may be different from the etching gases used in the traditional process, and the pressure in the step shown in FIG. 2D is larger than the pressure in the traditional process, such that the horizontal etching rate (such as along the directions D1 or D2) in the step shown in FIG. 2D may be larger than the horizontal etching rate in the traditional process. Therefore, it would be effective to clear the first barrier layer 31 on the side wall of the insulating layer 10 above the second pre-determined height P2.

Figure 2E:
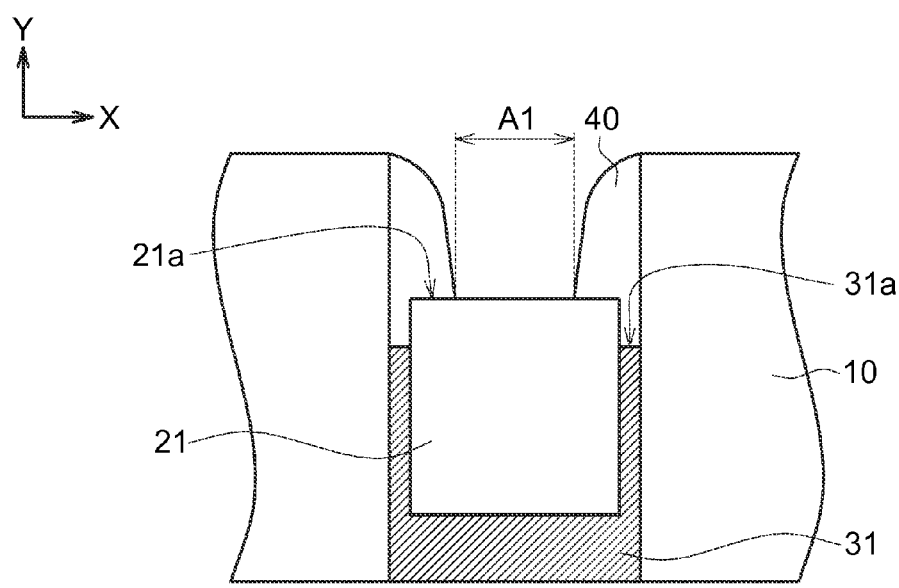

As shown in FIG. 2E, a spacer 40 covering the second top surface 31a of the first barrier layer 31 and a portion of the first top surface 21a of the first electrode layer 21 may be formed. Here, the spacer 40 may define a contact area A1 on the first top surface 21a.

In one embodiment of the disclosure, the spacer 40 may be formed by a deposition process, such as a LPCVD process, and the spacer 40 may be made of silicon nitride (SiN), silicon oxide (SiO), silicon oxynitride (SiON), the arbitrary combinations thereof or other suitable dielectric materials.

Figure 2F:
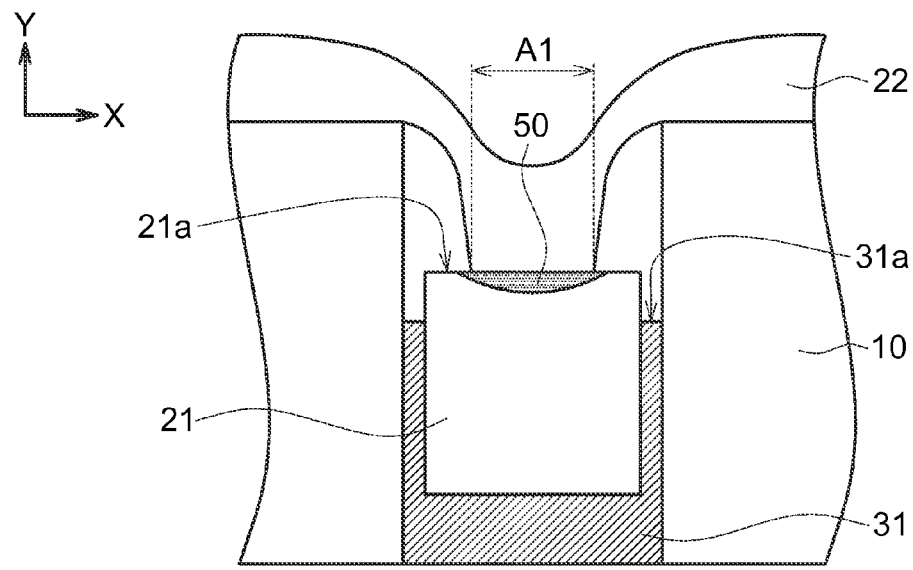

As shown in FIG. 2F, a memory layer 50 may be formed in the contact area A1. The memory layer 50 may include metal oxide, such as tungsten oxide ($WO_x$) or hafnium oxide ($HfO_x$). In one embodiment of the disclosure, the memory layer 50 may be formed in the contact area A1 by a deposition process. In another embodiment of the disclosure, the memory layer 50 may be formed by an oxidation process, such as a thermal oxidation process, directly performed on the contact area A1 of the first electrode 21.

In this embodiment, the steps of forming the memory layer 50 may include performing a thermal oxidation on the contact area A1 of the first electrode 21 to form a $WO_x$ layer.

Then, a second electrode layer 22 may be formed on the memory layer 50 and electrically connected to the memory layer 50. The material of the second electrode layer 22 and the manufacturing method of the second electrode layer 22 may be similar to those of the first electrode layer 21, and would not be described again herein.

Figure 2G:
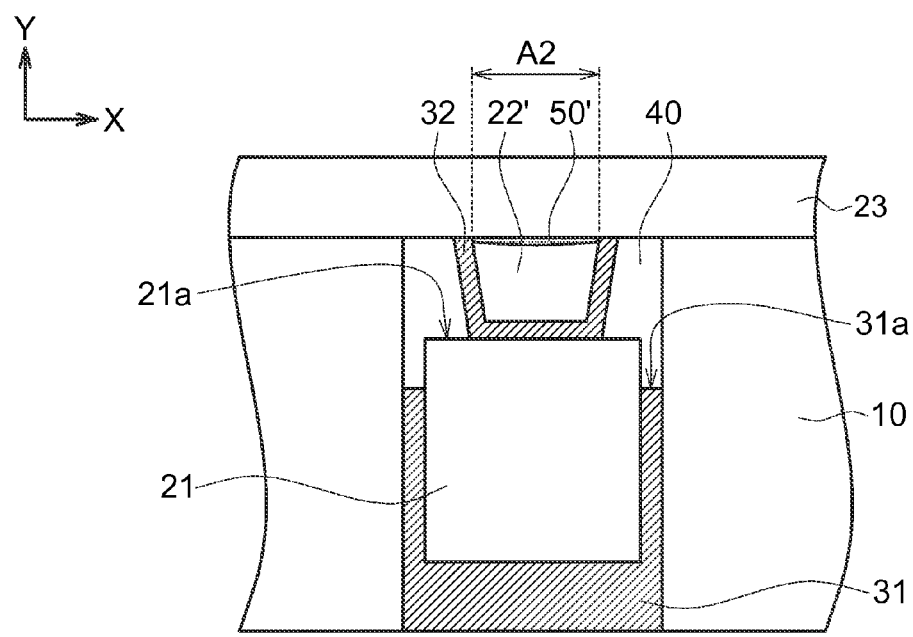

However, the disclosure is not limited thereto. In one embodiment of the disclosure, the step of forming the spacer 40 (the step shown in FIG. 2E) may be followed by the step shown in FIG. 2G. As shown in FIG. 2G, a second electrode layer 22' and a second barrier layer 32 may be formed. The second electrode layer 22' may be formed on the first electrode layer 21, and the second barrier layer 32 may be formed between the second electrode layer 22' and the spacer 40 and between the second electrode layer 22' and the first electrode 21.

Similarly, a contact area A2 may be defined on the top surface of the second electrode layer 22'. Then, a memory layer 50' may be formed in the contact area A2 and a third electrode layer 23 may be formed on the memory layer 50'. The third electrode layer 23 is electrically connected to the memory layer 50'. The material of the third electrode layer 23 and the manufacturing method of the third electrode layer 23 may be similar to those of the first electrode layer 21, and the material of the second barrier layer 32 and the manufacturing method of the second barrier layer 32 may be similar to those of the first barrier layer 31, which would not be described again herein.

According to the embodiments above, the corners 10*a* and 10*b* of the insulating layer 10 near the opening 102 may be maintained sharp, and the size of the opening 102 may be maintained by the two-step (or multi-step) etching process of the disclosure. That is, it is easier to achieve a smaller contact size in the memory structure 100 according to the embodiments of the disclosure. Further, the controllability may be enhanced and the flatter contact surface may be formed by the two-step (or multi-step) etching process of the disclosure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory structure, comprising:
   an insulating layer having a recess;
   a first electrode layer formed in the recess and having a first top surface; and
   a first barrier layer formed between the insulating layer and the first electrode layer, and having a second top surface; and
   a spacer covering the second top surface and a portion of the first top surface;
   wherein the first top surface and the second top surface are lower than an opening of the recess.

2. The memory structure according to claim 1, wherein the spacer defines a contact area on the first top surface.

3. The memory structure according to claim 2, further comprising:
   a memory layer formed in the contact area; and
   a second electrode layer formed on the memory layer and electrically connected to the memory layer.

4. The memory structure according to claim 1, further comprising:
   a second electrode layer formed on the first electrode layer; and
   a second barrier layer formed between the second electrode layer and the spacer and between the second electrode layer and the first electrode layer.

5. The memory structure according to claim 4, wherein a contact area is defined on a top surface of the second electrode layer.

6. The memory structure according to claim 5, further comprising:
   a memory layer formed in the contact area; and
   a third electrode layer formed on the memory layer and electrically connected to the memory layer.

7. The memory structure according to claim 1, wherein the insulating layer comprises silicon dioxide, the first electrode layer comprises tungsten, and the first barrier layer comprises titanium nitride.

8. A memory structure, comprising:
   an insulating layer having a recess;
   a first electrode layer formed in the recess and having a first top surface; and
   a first barrier layer formed between the insulating layer and the first electrode layer, and having a second top surface;
   a second electrode layer formed on the first electrode layer; and
   a second barrier layer surrounding the second electrode layer and between the second electrode layer and the first electrode layer;
   wherein the first top surface and the second top surface are lower than an opening of the recess.

9. The memory structure according to claim 8, wherein the second top surface is lower than the first top surface.

10. The memory structure according to claim 8, further comprising:
    a spacer covering the second top surface and a portion of the first top surface.

11. The memory structure according to claim 10, wherein the spacer defines a contact area on the first top surface.

12. The memory structure according to claim 11, further comprising:
    a memory layer formed in the contact area; and
    a second electrode layer formed on the memory layer and electrically connected to the memory layer.

13. The memory structure according to claim 8, wherein a contact area is defined on a top surface of the second electrode layer.

14. The memory structure according to claim 13, further comprising:
    a memory layer formed in the contact area; and
    a third electrode layer formed on the memory layer and electrically connected to the memory layer.

* * * * *